United States Patent
Goyal et al.

(10) Patent No.: US 8,643,411 B1
(45) Date of Patent: Feb. 4, 2014

(54) SYSTEM FOR GENERATING GATED CLOCK SIGNALS

(71) Applicant: Freescale Semiconductor, Inc., Austin, TX (US)

(72) Inventors: Gaurav Goyal, Noida (IN); Amol Agarwal, New Delhi (IN); Abhishek Mahajan, Chandigarh (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/665,921

(22) Filed: Oct. 31, 2012

(51) Int. Cl.
*H03L 7/00* (2006.01)

(52) U.S. Cl.
USPC .......................... 327/141; 327/165

(58) Field of Classification Search
USPC ......................... 327/141, 165, 291
See application file for complete search history.

(56) References Cited

U.S. PATENT DOCUMENTS

| | | | |
|---|---|---|---|
| 6,204,695 B1* | 3/2001 | Alfke et al. | 326/93 |
| 6,552,572 B1* | 4/2003 | Cheung et al. | 326/93 |
| 6,822,478 B2 | 11/2004 | Elappuparackal | |
| 7,023,240 B2* | 4/2006 | Elappuparackal | 326/40 |
| 7,274,240 B2* | 9/2007 | Siegler et al. | 327/291 |
| 7,443,222 B1* | 10/2008 | Saxe et al. | 327/291 |
| 7,576,582 B2* | 8/2009 | Lee et al. | 327/202 |
| 8,434,047 B1* | 4/2013 | Jiang et al. | 716/133 |
| 2001/0052096 A1 | 12/2001 | Huijbregts | |
| 2007/0016883 A1* | 1/2007 | Ham | 716/10 |
| 2010/0109707 A1* | 5/2010 | Srivastava et al. | 326/93 |

* cited by examiner

*Primary Examiner* — Ryan Jager
(74) *Attorney, Agent, or Firm* — Charles Bergere (57) ABSTRACT

A system for generating a gated clock signal includes an AND gate and a clock gating cell. The AND gate receives a reset signal and an input clock signal and generates a clock signal that is provided to a clock input terminal of the clock gating cell. The clock gating cell generates a gated clock signal based on an input signal and the clock signal. Gating the clock input to a latch allows a means for conserving power.

19 Claims, 4 Drawing Sheets

SYSTEM FOR GENERATING GATED CLOCK SIGNALS

BACKGROUND OF THE INVENTION

The present invention relates generally to a clock cell for an integrated circuit, and, more particularly, to a gated clock gating cell.

Digital circuits use clock signals for synchronizing operations between different functional blocks. A functional block may refer to multiple storage elements including flip-flops and latches that generate an output based on the clock signals. However, the storage elements are not always required to alter their output states during operation and providing a continuous clock input signal at clock input terminals of the storage elements causes repetitive charging and discharging of the capacitive load associated with the clock input terminals, which can lead to high power consumption.

To reduce power consumption, clock input signals are switched using clock gating circuits or cells to obtain gated clock input signals. The gated clock input signals toggle only when logic states of the storage elements need to be changed.

Figure 1:
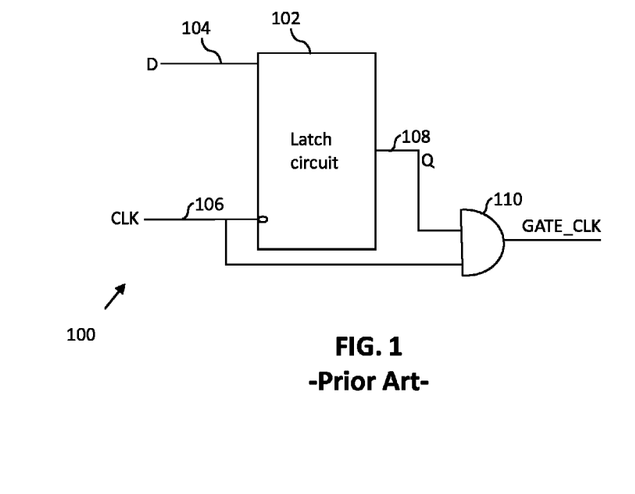
FIG. 1 is a schematic block diagram of a conventional clock gating cell.

FIG. 1 shows a schematic block diagram of a conventional clock gating cell 100. The conventional clock gating cell 100 includes a latch 102 that has an input terminal 104, a clock input terminal 106, an output terminal 108. An AND gate 110 is connected to the output terminal 108. An input signal (D) is provided at the input terminal 104 and a clock input signal (CLK) is provided at the clock input terminal 106. The clock input signal CLK toggles between logic high and low states. When the clock input signal CLK goes low, the latch 102 latches the input signal D, i.e., an output signal (Q) is generated at the output terminal 108. When the clock input signal CLK goes high, the output signal Q remains latched to in the previous state. The output signal Q and the clock input signal CLK are provided at input terminals of the AND gate 110, which generates a gated clock signal (GATE_CLK). Since the clock input signal CLK is gated using the output signal Q, the gated clock signal GATE_CLK toggles only when the state of the output signal Q changes. Thus, the gated clock signal GATE_CLK toggles only when an enable signal (provided as the input signal D) switches to a logic high.

However, the clock input signal CLK continues to toggle at the clock input terminal 106 of the latch 102 irrespective of changes in the output state of the latch 102, which leads to continuous charging and discharging of input capacitance at the clock input terminal 106, which increases the power dissipation and power consumption of the conventional clock gating cell 100.

Therefore, it would be advantageous to have a clock gating cell that reduces the toggling of the clock input signal CLK at the clock input terminal of the latch, that has low dynamic power dissipation and consumption, and that overcomes the above-mentioned limitations of conventional clock gating cells.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a clock gating circuit is provided. The clock gating circuit includes a latch circuit and first and second logic circuits. The first logic circuit receives a reset signal and an input clock signal and outputs a latch clock signal at its output terminal based on the reset signal. The latch circuit has a reset terminal for receiving the reset signal, an input terminal for receiving an enable signal, a clock input terminal connected to the output terminal of the first logic circuit for receiving the latch clock signal, and an output terminal for generating a clocked enable signal. The second logic circuit has a first input terminal connected to the output terminal of the first logic circuit for receiving the latch clock signal and a second input terminal connected to the output terminal of the latch circuit for receiving the clocked enable signal. The second logic circuit generates a gated clock signal based on the clocked enable signal.

In another embodiment of the present invention, a system for generating a gated clock signal is provided. The system includes a first logic circuit and a clock gating cell. The first logic circuit receives a reset signal and an input clock signal and generates a latch clock signal. The clock gating cell, which is connected to the first logic circuit, includes a latch circuit and a second logic circuit. The latch circuit has a reset terminal for receiving the reset signal, an input terminal for receiving an enable signal, a clock input terminal that receives the latch clock signal, and an output terminal for generating a clocked enable signal. The second logic circuit has a first input terminal connected to the output terminal of the first logic circuit for receiving the latch clock signal and a second input terminal connected to the output terminal of the latch circuit for receiving the clocked enable signal. The second logic circuit generates the gated clock signal based on the clocked enable signal.

In yet another embodiment of the present invention, an integrated circuit is provided. The integrated circuit includes a plurality of digital logic elements, a plurality of first logic circuits, and a plurality of clock gating cells. Each clock gating cell includes a latch and a second logic circuit. The first logic circuits and the clock gating cells are as described above and provide gated clock signals to the digital logic elements.

In various embodiments of the present invention, the first and second logic circuits may comprise AND gates or their equivalents. One AND gate is provided with a reset signal and an input clock signal and selectively provides the input clock signal (i.e., the latch clock signal) to a clock input terminal of the clock gating cell based on the reset signal. Thus, the clock input terminal of the latch of the clock gating cell receives an active input clock signal only when the reset signal is de-asserted, which prevents continuous toggling of the input clock to the latch when the clock gating cell is in a reset state. Reducing such clock toggling considerably reduces undesired charging and discharging of an input capacitance at the clock input terminal of the latch, which reduces dynamic power consumption and dissipation of the clock gating cell. Simply put, the present invention can be used to gate the clock to latches or flip-flops that are under reset and also gate the clock gating cell itself to reduce overall power.

Figure 2:
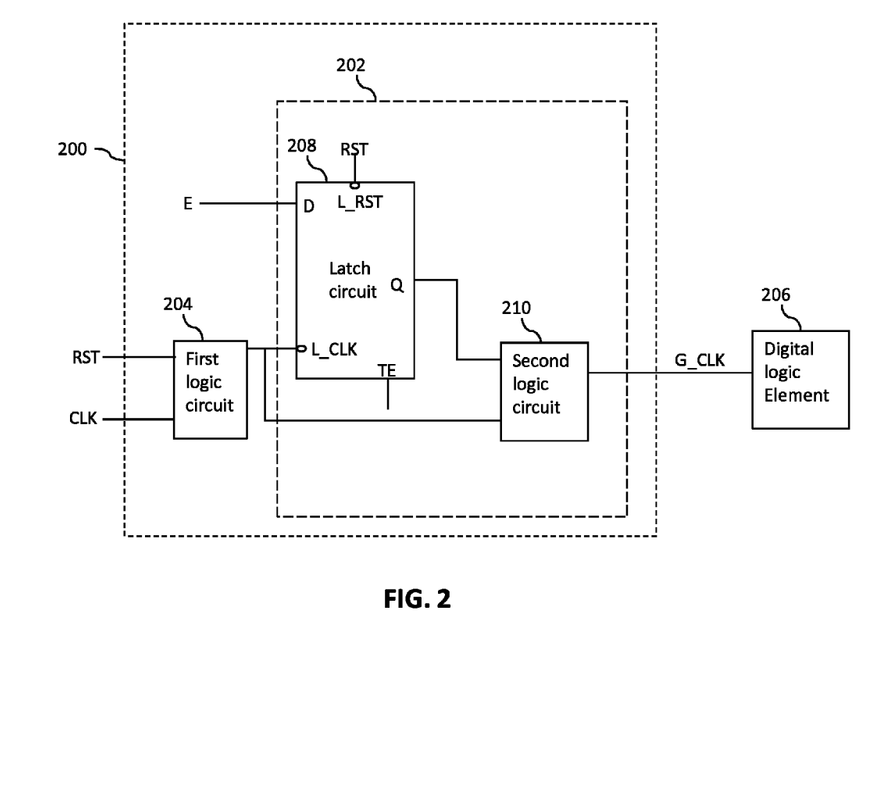
FIG. 2 is a schematic block diagram of a system for generating a gated clock signal in accordance with an embodiment of the present invention.

Referring now to FIG. 2, a schematic block diagram of a circuit or system 200 for generating a gated clock signal (G_CLK) in accordance with an embodiment of the present invention is shown. The system 200 includes a clock gating cell 202 and a first logic circuit 204. In one embodiment, the clock gating cell 202 is a standard library cell or part of a standard library used to design integrated circuits. The system 200 is connected to a digital logic element 206, which may be another functional block of an integrated circuit. In another embodiment of the invention, the clock gating cell 202 and the first logic circuit 204 (i.e., the system or circuit 200) comprise a standard library cell.

The clock gating cell 202 includes a latch circuit 208 and a second logic circuit 210. In various embodiments of the present invention, the system 200 and the digital logic element 206 are a part of an integrated circuit (IC). The system 200 generates and provides the gated clock signal G_CLK to the digital logic element 206. It will be apparent to a person skilled in the art that the IC may include multiple clock gating cells 202 that provide gated clock signals G_CLK(s) to corresponding digital logic elements 206.

The first logic circuit 204 receives a reset signal (RST) at a first input terminal and an input clock signal (CLK) at a second input terminal and outputs a latch clock signal; more particularly, the first logic circuit 204 selectively outputs the input clock signal CLK at its output terminal based on the reset signal RST. In one embodiment of the present invention, the first logic circuit 204 comprises an AND gate, which generates the latch clock signal, which corresponds to the input clock signal CLK only when the reset signal RST is de-asserted or in a logic high state, i.e., when the latch circuit 208 is not in a reset state. In another embodiment of the present invention, the first logic circuit 204 may be one of an OR gate, a NOT gate, a NOR gate, a NAND gate, an XOR gate, an XNOR gate, or any combinational logic circuit.

The output terminal of the first logic circuit 204 is connected to a clock input terminal (L_CLK) of the latch circuit 208 such that the first logic circuit 204 provides the latch clock signal to the clock input terminal L_CLK of the latch circuit 208. Since the first logic circuit 204 transmits the input clock signal CLK only when the reset signal RST is de-asserted, continuous toggling of the input clock signal CLK at the clock input terminal L_CLK of the latch circuit 208 is eliminated.

An input terminal (D) of the latch circuit 208 receives an enable signal (E) and a test enable terminal (TE) receives a test enable signal. The latch circuit 208 outputs the enable signal E based on the input clock signal CLK (the latch clock signal) as a clocked enable signal at its Q output terminal. When the latch circuit 208 is in the reset state, the enable signal E is not output at the output terminal Q of the latch circuit 208. The output terminal of the latch circuit 208 is connected to a first input terminal of the second logic circuit 210 and the output terminal of the first logic circuit 204 is connected to a second input terminal of the second logic circuit 210. The latch circuit 208 provides a clocked enable signal E to the first input terminal of the second logic circuit 210 and the first logic circuit 204 provides the latch clock signal to the second input terminal of the second logic circuit 210. The second logic circuit 210 then generates the gated clock enable signal G_CLK. In an embodiment of the present invention, the second logic circuit 210 may comprise an AND gate, an OR gate, a NOT gate, a NOR gate, a NAND gate, an XOR gate, an XNOR gate, or a combination thereof, such that the gated clock signal G_CLK toggles only when the clocked enable signal is high and the reset signal is de-asserted. The second logic circuit 210 provides the gated clock signal G_CLK to the digital logic element 206. The digital logic element 206 may be a flip-flop, a latch, a register, or any digital combinatorial circuit that operates on the gated clock signal G_CLK.

Figure 3:
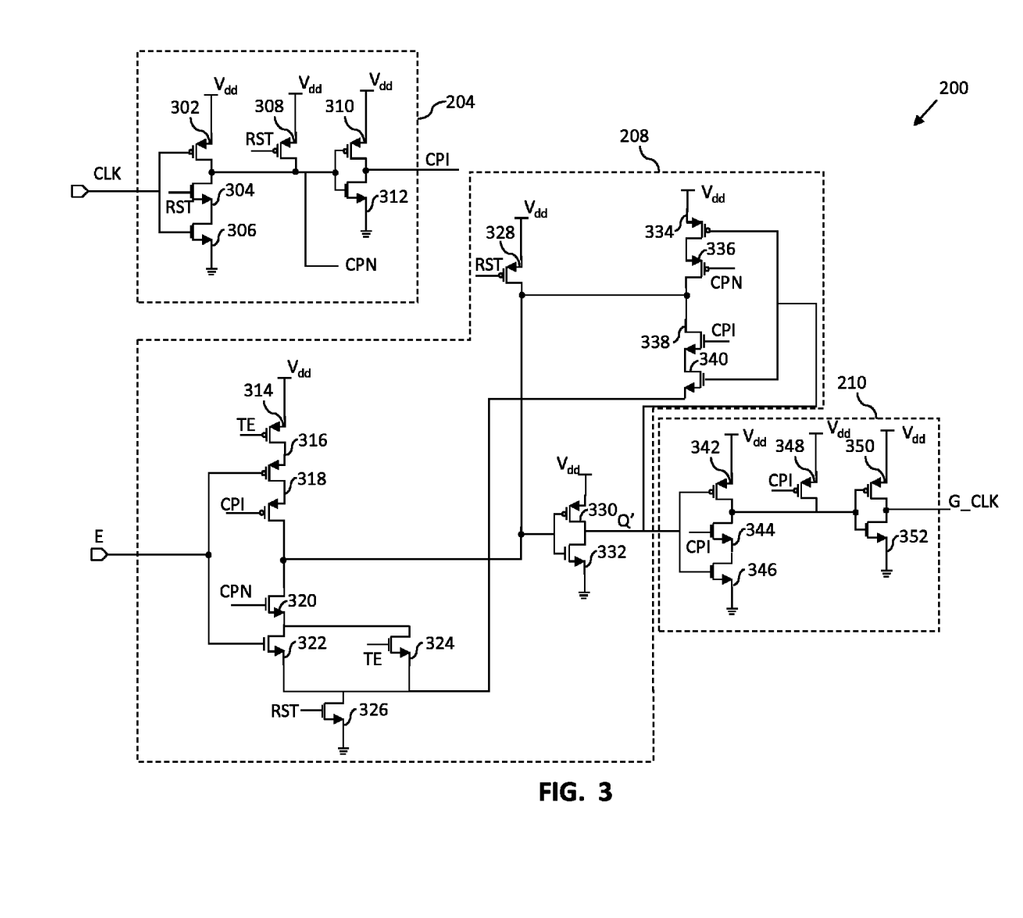
FIG. 3 is a more detailed schematic circuit diagram of the system for generating a gated clock signal of FIG. 2, in accordance with an embodiment of the present invention.

FIG. 3 is a schematic circuit diagram of the system 200 in accordance with an embodiment of the present invention. In the embodiment shown, the first and second logic circuits 204 and 210 comprise AND gates, where the first logic circuit 204 receives as inputs the input clock signal CLK and the reset signal RST and outputs the latch clock signal CPI. An inverted input clock signal CPN also is provided by the first logic circuit 204. The first logic circuit 204 includes six transistors (first through sixth transistors) 302-312. The second logic circuit 210 receives as inputs the clocked enable signal Q' and the latch clock signal CPI and outputs the gated clock signal G_CLK. The second logic circuit 210 includes six transistors (twenty-first through twenty-sixth transistors) 342-352 The latch circuit 208 includes fourteen transistors (seventh through twentieth transistors) 314-340.

A voltage supply $V_{dd}$ is connected to a source terminal of a first transistor 302. A drain terminal of the first transistor 302 is connected to a drain terminal of a second transistor 304 and a gate terminal of the first transistor 302 is provided with an input clock signal (CLK). A source terminal of the second transistor 304 is connected to a drain terminal of the third transistor 306 and a gate terminal of the second transistor 304 is provided with a reset signal (RST). A gate terminal of the third transistor 306 is connected to the gate terminal of the first transistor 302 for receiving the input clock signal CLK and a source terminal of the third transistor 306 is connected or shorted to ground. A source terminal of the fourth transistor 308 is connected to the voltage supply $V_{dd}$, a gate terminal is provided with the reset signal RST, and a drain terminal is connected to the drain terminals of the first and second transistors 302 and 304. The signal generated at the drain terminals of the first, second and fourth transistors 302, 304, 308 is an inverted input clock signal (CPN). The inverted input clock signal CPN is input to a first inverter and the first inverter outputs the latch clock signal CPI. In an embodiment of the invention, the first inverter comprises a fifth transistor 310 having a source terminal connected to the voltage supply $V_{dd}$, and a gate terminal connected to the drain terminals of the first, second and fourth transistors 302, 304, 308, and a sixth transistor 312 having a source terminal connected to ground, and a gate terminal connected to the gate terminal of the fifth transistor 310 and the drain terminals of the first, second and fourth transistors 302, 304, 308. The drain terminals of the fifth and sixth transistors 310, 312 are connected together and provide the latch clock signal CPI.

As mentioned above, the latch circuit 208 comprises seventh through twentieth transistors 314-340. The seventh transistor 314 has a sourced connected to the voltage supply $V_{dd}$, and a gate terminal that receives the test enable signal (TE). A source terminal of the eighth transistor 316 is connected to the drain terminal of the seventh transistor 314, and a gate terminal of the eighth transistor 316 receives the enable signal (E).

A drain terminal of the eighth transistor 316 is connected to a source terminal of the ninth transistor 318 and a gate terminal of the ninth transistor 318 receives the latch clock signal (CPI). A drain terminal of the ninth transistor 318 is connected to a drain terminal of the tenth transistor 320. A gate terminal of the tenth transistor 320 is provided with the inverted input clock signal (CPN), which was generated at the drain terminals of the first, second and fourth transistors 302, 304, 308. A source terminal of the tenth transistor 320 is connected to a drain terminal of the eleventh transistor 322. A gate terminal of the eleventh transistor 322 is connected to the gate terminal of the eighth transistor 316 for receiving the enable signal E, and a source terminal of the eleventh transistor 322 is connected to a drain terminal of the thirteenth transistor 326. A drain terminal of the twelfth transistor 324 is connected to the source terminal of the tenth transistor 320 and the drain terminal of the eleventh transistor 322, a gate terminal of the twelfth transistor 324 is provided with the test enable signal TE, and a source terminal of the twelfth transistor 324 is connected to the drain terminal of the thirteenth transistor 326. A gate terminal of the thirteenth transistor 326 is provided with the reset signal RST and a source terminal of the thirteenth transistor 326 is connected to ground.

A source terminal of the fourteenth transistor 328 is connected to the voltage supply $V_{dd}$, a gate terminal of the fourteenth transistor 328 is provided with the reset signal RST, and a drain terminal of the fourteenth transistor 328 is connected to the drain terminals of the ninth and tenth transistors 318 and 320. The fifteenth transistor 330 has a source terminal connected to the voltage supply $V_{dd}$, a gate terminal connected to the drain terminals of the ninth, tenth and fourteenth transistors 318, 320 and 328, and a drain terminal connected to a drain terminal of the sixteenth transistor 332. A gate terminal of the sixteenth transistor 332 is connected to the gate terminal of the fifteenth transistor 330, and a source terminal of the sixteenth transistor 332 is connected to ground. The clocked enable signal is generated at the drain terminals of the fifteenth and sixteenth transistors 330, 332.

The seventeenth transistor 334 has a source terminal connected to the voltage supply $V_{dd}$, a drain terminal connected to a source terminal of the eighteenth transistor 336, and a gate terminal connected to a gate terminal of the twentieth transistor 340 and to the drain terminals of the fifteenth and sixteenth transistors 330 and 332. A gate terminal of the eighteenth transistor 336 is provided with the inverted input clock signal CPN, and the drain terminal of the eighteenth transistor is connected to a drain terminal of the nineteenth transistor 338 and to the drain terminals of the ninth, tenth and fourteenth transistors 318, 320 and 328. A gate terminal of the nineteenth transistor 338 is provided with the latch clock signal CPI, and a source terminal of the nineteenth transistor 338 is connected to a drain terminal of the twentieth transistor 340. A source terminal of the twentieth transistor 340 is connected to the source terminals of the eleventh and twelfth transistors 322, 324 and the drain terminal of the thirteenth transistor 326.

As mentioned above, the second logic circuit comprises twenty-first through twenty-sixth transistors 342-352. The twenty-first transistor 342 has a source connected to the voltage supply $V_{dd}$, and a gate terminal connected to the drain terminals of the fifteenth and sixteenth transistors 330 and 332 such that it receives the clocked enable signal. The drain terminals of the twenty-first and twenty-second transistors 342, 344 are connected to each other and provide an inverted gated clock signal. A source terminal of the twenty-second transistor 344 is connected to a drain terminal of the twenty-third transistor 346 and a gate terminal of the twenty-second transistor 344 receives the latch clock signal CPI. A gate terminal of the twenty-third transistor 346 is connected to the gate terminal of the twenty-first transistor 342 and a source terminal of the twenty-third transistor 346 is connected to ground. The twenty-fourth transistor 348 has a source terminal connected to the voltage supply $V_{dd}$, a gate terminal that receives the latch clock signal CPI, and a drain terminal connected to the drain terminals of the twenty-first and twenty-second transistors 342 and 344.

The inverted gated clock signal generated at the drain terminals of the twenty-first and twenty-second transistors 342, 344 is input to a second inverter circuit and an output of the second inverter circuit is the gated clock signal. The second inverter is formed by the twenty-fifth and twenty-sixth transistors 350, 352. More particularly, the twenty-fifth transistor 350 has a source terminal that receives the voltage supply $V_{dd}$, a gate terminal connected to the drain terminals of the twenty-first, twenty-second and twenty-fourth transistors 342, 344, 348 such that it receives the inverted gated clock signal, and a drain terminal connected to a drain terminal of the twenty-sixth transistor 352; and the twenty-sixth transistor 352 has a gate terminal connected to the gate terminal of the twenty-fifth transistor 350, and a source terminal connected to ground.

Figure 4:
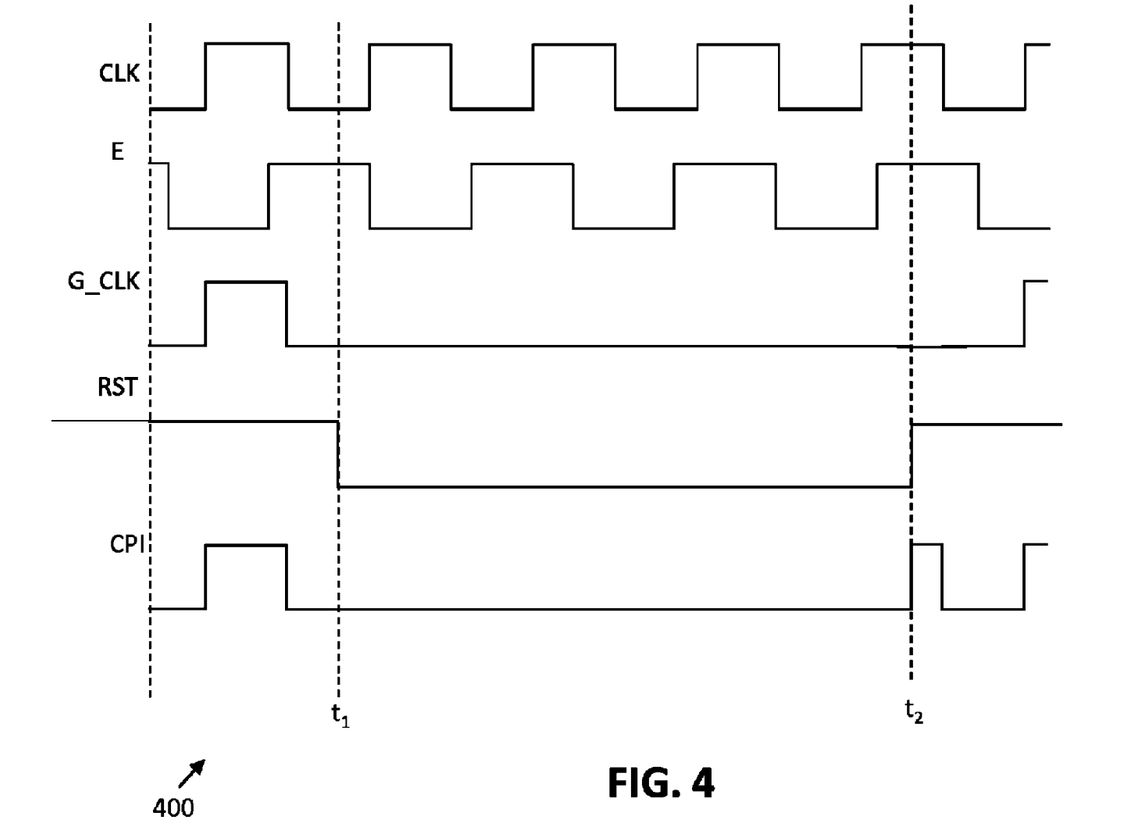
FIG. 4 is a timing diagram of various signals of the circuit of FIG. 3, in accordance with an embodiment of the present invention.

FIG. 4 is a timing diagram 400 of various signals of the system 200. The timing diagram 400 includes signal waveforms for the input clock signal (CLK), the enable signal (E), the gated clock signal (G_CLK), the reset signal (RST), and the latch clock signal (CPI) at time instances $t_1$ and $t_2$, as will be explained in more detail below. The operation of the first logic circuit 204, the latch circuit 208, and the second logic circuit 210 will be explained below using exemplary values of the input clock signal CLK and the reset signal RST. In the examples presented below, the test enable signal (TE) remains low, resulting in the seventh transistor 314 being switched on.

In a first example, when CLK=0 and RST=1 (i.e., when the reset signal RST is de-asserted), the first and second transistors 302 and 304 are switched on and the third transistor 306 is switched off, which pulls up a voltage (i.e., the inverted input clock signal CPN) at the drain terminals of the first and second transistors 302 and 304 to a logic high and switches on the sixth transistor 312 and switches off the fifth transistor 310. A voltage (the latch clock signal CPI is generated based on the reset signal RST) at the drain terminals of the fifth and sixth transistors 310 and 312 is also pulled low. Since, the inverted input clock signal CPN is high and the latch clock signal CPI is low, the eighteenth and nineteenth transistors 336 and 338 are switched off. As a result the seventeenth through twentieth transistors 334-340 remain non-operational when the latch circuit 208 is functioning. The seventh, ninth, tenth, and thirteenth transistors 314, 318, 320, and 326 are switched on by way of which the inverted clock enable signal is generated at the drain terminals of the ninth and tenth transistors 318 and 320. If the enable signal E is high, then the inverted clock enable signal at the drain terminals of the ninth and tenth transistors 318 and 320 goes low, and vice-versa. The fifteenth and sixteenth transistors 330 and 332, which form an inverter, invert the inverted clock enable signal to generate the clocked enable signal Q'. The clocked enable signal Q' is provided to the gate terminals of the twenty-first and twenty-third transistors 342 and 346. The clocked enable signal Q' is not transmitted beyond the twenty-second transistor 344 (which is switched off), irrespective of its logic state, due to a logic low state of the latch clock signal CPI. Also, because the latch clock signal CPI is low, the twenty-fourth transistor 348 is switched on, which pulls up a voltage at the gate terminals of the twenty-fifth and twenty-sixth transistors 350 and 352, switches off the twenty-fifth transistor 350, and switches on the twenty-sixth transistor 352. As a result, the gated clock signal G_CLK goes low. Thus, the gated clock signal G_CLK remains low as long as the input clock signal CLK is low, and it is independent of the logic state of the enable signal E (as the reset signal RST is de-asserted).

In a second example, when CLK=1, and RST=1 (i.e., at time $t_2$ when the reset signal RST is de-asserted) the second and third transistors 304 and 306 are switched on and the first transistor 302 is switched off, which pulls down a voltage (i.e., the inverted input clock input signal CPN) at the drain terminals of the first and second transistors 302 and 304 to a logic low state, i.e., CPN=0 and switches on the fifth transistor 310. The latch clock signal CPI switches to a logic high state. Since, the ninth and tenth transistors 318 and 320 are switched off (CPI=1 and CPN=0), the enable signal E is not transmitted beyond the eighth and eleventh transistors 316 and 322. The clocked enable signal Q' generated at the drain terminals of the fifteenth and sixteenth transistors 330 and 332 is maintained (by way of the eighteenth and nineteenth transistors 336 and 338 being switched on) at the logic state of the enable signal E captured in a previous clock cycle (i.e., when CLK=0 previously). The previously captured logic state of the enable signal E is transmitted to the gate terminals of the twenty-first and twenty-third transistors 342 and 346 and by way of the twenty-second transistor 344 (which is switched on) to the gate terminals of the twenty-fifth and twenty-sixth transistors 350 and 352 and is eventually output at the drain terminals of the twenty-fifth and twenty-sixth transistors 350 and 352 as the gated clock signal G_CLK. At time $t_2$, the input clock signal CLK is in an active high phase and the reset signal RST transitions from low to high. This may cause a glitch in the latch clock signal CPI and subsequently in the gated clock signal G_CLK. However, the thirteenth and fourteenth transistors 326 and 328 prevent occurrence of the glitch in the gated clock signal G_CLK. That is, since the thirteenth transistor 326 is switched off when RST=0 and the fourteenth transistor 328 is switched on, the drain terminals of the ninth and tenth transistors 318 and 320 are maintained at a logic high state and cause the clocked enable signal Q' to remain in a logic low state, which in turn causes the gated clock signal G_CLK to remain in a logic low state, thus preventing the occurrence of the glitch.

In a third example, the reset signal RST=0 (i.e., at time instance $t_1$ when the reset signal RST is asserted) switches off the second transistor 304 and switches on/off the first and third transistors 302 and 306 based on the logic state of the input clock signal CLK. Since the reset signal RST is low, the fourth transistor 308 is switched on (independent of the logic state of the input clock signal CLK), which pulls up a voltage (i.e., the inverted input clock signal CPN) at the drain of the fourth transistor 308 to a logic high state. The sixth transistor 312 is switched on, which switches the latch clock signal CPI to low. The latch clock signal CPI is output based on the reset signal RST. The logic low and high states of the latch clock signal CPI and the inverted clock signal CPN, respectively, switch off the eighteenth and nineteenth transistors 336 and 338. Therefore, the seventeenth through twentieth transistors 334-340 are non-operational. As RST=0, the thirteenth transistor 326 is switched off, which ensures that a logic state at the gate terminals (i.e., the inverted clocked enable signal) of the fifteenth and sixteenth transistors 330 and 332 is not equal to logic zero when the enable signal E is in a logic high state. The inverted clocked enable signal is switched to a logic high state by the fourteenth transistor 328, which is switched on.

As the inverted clocked enable signal provided to the gate terminals of the fifteenth and sixteenth transistors 330 and 332 is in a logic high state, the clocked enable signal Q' output at the drain terminals of the fifteenth and sixteenth transistors 330, 332 is in a logic low state. The logic low state of the clocked enable Q' signal causes the twenty-first transistor 342 to switch on and since the latch clock signal CPI is in a logic low state, the twenty-fourth transistor 348 is switched on. As a result, the twenty-sixth transistor 352 is switched on, which switches the gated clock signal G_CLK to a logic low state. Thus, the gated clock signal G_CLK stays low independent of the logic state of the input clock signal CLK (as long as the reset signal RST is asserted). When the reset signal RST transitions from high to low and the input clock signal CLK goes high, a glitch may occur in the latch clock signal CPI and subsequently in the gated clock signal G_CLK. Since assertion of the reset signal RST is asynchronous and spreads over more than one clock cycle of the input clock signal CLK, the glitch (if it occurs) settles without impacting the combined operation of the first logic circuit 204, the latch circuit 208, and the second logic circuit 210.

Thus, the present invention provides a clock gating cell with reset as one of its inputs. The input clock to the clock gating cell is gated with the reset input such that both the output logic of the clock gating cell and the clock gating cell itself do not toggle when the logic driven by the clock gating cell is in reset state. The circuit is an improvement over conventional clock gating cells because it reduces the dynamic power consumption because the input capacitance of the latch clock pin is much higher than the input capacitance of the AND gate used to stop the clock supply of the latch.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A circuit for generating a gated clock signal, comprising:
a first logic circuit for receiving a reset signal and an input clock signal and generating a latch clock signal at an output terminal thereof;
a latch circuit having a reset terminal that receives the reset signal, an input terminal that receives an enable signal, a clock input terminal connected to the output terminal of the first logic circuit for receiving the latch clock signal, and an output terminal for providing a clocked enable signal; and
a second logic circuit having a first input terminal connected to the output terminal of the first logic circuit for receiving the latch clock signal and a second input terminal connected to the output terminal of the latch circuit for receiving the clocked enable signal, wherein the second logic circuit generates the gated clock signal.

2. The circuit of claim 1, wherein the first and second logic circuits each comprise at least one of an AND gate, an OR gate, a NOT gate, a NOR gate, a NAND gate, an XOR gate, an XNOR gate, and a combinational logic circuit.

3. The circuit of claim 1, wherein each of the first and second logic circuits comprises an AND gate.

4. The circuit of claim 1, wherein the first logic circuit comprises:
a first transistor (302) having a source terminal for receiving a supply voltage, and a gate terminal for receiving the input clock signal;

a second transistor (304) having a drain terminal connected to a drain terminal of the first transistor, and a gate terminal for receiving the reset signal, wherein an inverted input clock signal is generated at the drain terminals of the first and second transistors;

a third transistor (306) having a drain terminal connected to a source terminal of the third transistor, a gate terminal connected to the gate terminal of the first transistor for receiving the input clock signal, and a source terminal connected to ground;

a fourth transistor (308) having a source terminal for receiving the supply voltage, a gate terminal for receiving the reset signal, and a drain terminal connected to the drain terminals of the first and second transistors for receiving the inverted input clock signal; and a first inverter, connected to the drain terminals of the first and second transistors and the drain terminal of the fourth transistor, for receiving the inverted input clock signal and generating the latch clock signal.

5. The circuit of claim 4, wherein the first inverter comprises:

a fifth transistor (310) having a source terminal for receiving the supply voltage, and a gate terminal connected to the drain terminals of the first and second transistors for receiving the inverted input clock signal; and a sixth transistor (312) having a drain terminal connected to a drain terminal of the fifth transistor, a gate terminal connected to the gate terminal of the fifth transistor for receiving the inverted input clock signal, and a source terminal connected to ground, wherein the latch clock signal is generated at the drain terminals of the fifth and sixth transistors.

6. The circuit of claim 5, wherein the latch circuit comprises:

a seventh transistor (314) having a source terminal for receiving the supply voltage, and a gate terminal for receiving a test enable signal;

an eighth transistor (316) having a source terminal connected to a drain terminal of the seventh transistor, and a gate terminal for receiving the enable signal;

a ninth transistor (318) having a source terminal connected to a drain terminal of the eighth transistor, and a gate terminal for receiving the latch clock signal;

a tenth transistor (320) having a drain terminal connected to a drain terminal of the ninth transistor, and a gate terminal for receiving the inverted input clock signal, wherein an inverted clocked enable signal is generated at the drain terminals of the ninth and tenth transistors;

an eleventh transistor (322) having a drain terminal connected to a source terminal of the tenth transistor, and a gate terminal connected to the gate terminal of the eighth transistor for receiving the enable signal;

a twelfth transistor (324) having a drain terminal connected to the source and drain terminals of the tenth and eleventh transistors, respectively, and a gate terminal that receives the test enable signal;

a thirteenth transistor (326) having a drain terminal connected to source terminals of the eleventh and twelfth transistors, a gate terminal for receiving the reset signal, and a source terminal connected to ground;

a fourteenth transistor (328) having a source terminal for receiving the supply voltage, a gate terminal for receiving the reset signal, and a drain terminal connected to the drain terminals of the ninth and tenth transistors for receiving the inverted clocked enable signal;

a fifteenth transistor (330) having a source terminal for receiving the supply voltage, and a gate terminal connected to the drain terminals of the ninth and tenth transistors for receiving the inverted clocked enable signal;

a sixteenth transistor (332) having a drain terminal connected to a drain terminal of the fifteenth transistor, a gate terminal connected to the drain terminals of the ninth and tenth transistors for receiving the inverted clocked enable signal, and a source terminal connected to ground, wherein the clocked enable signal is generated at the drain terminals of the fifteenth and sixteenth transistors;

a seventeenth transistor (334) having a source terminal for receiving the supply voltage, and a gate terminal connected to the drain terminals of the fifteenth and sixteenth transistors for receiving the clocked enable signal;

an eighteenth transistor (336) having a source terminal connected to a drain terminal of the seventeenth transistor, and a gate terminal for receiving the inverted input clock signal;

a nineteenth transistor (338) having a drain terminal connected to a drain terminal of the eighteenth transistor and to the drain terminal of the fourteenth transistor, and a gate terminal that receives the latch clock signal; and a twentieth transistor (340) having a drain terminal connected to a source terminal of the nineteenth transistor, a gate terminal connected to the gate terminal of the seventeenth transistor and to the drain terminals of the fifteenth and sixteenth transistors for receiving the clocked enable signal, and a source terminal connected to the source terminals of the eleventh and twelfth transistors.

7. The circuit of claim 6, wherein the second logic circuit comprises:

a twenty-first transistor (342) having a source terminal for receiving the supply voltage, and a gate terminal for receiving the clocked enable signal;

a twenty-second transistor (344) having a drain terminal connected to a drain terminal of the twenty-first transistor, and a gate terminal that receives the latch clock signal, wherein an inverted gated clock signal is generated at the drain terminals of the twenty-first and twenty-second transistors;

a twenty-third transistor (346) having a drain terminal connected to a source terminal of the twenty-second transistor, a gate terminal connected to the gate terminal of the twenty-first transistor for receiving the clocked enable signal, and a source terminal connected to ground;

a twenty-fourth transistor (348) having a source terminal for receiving the supply voltage, a gate terminal that receives the latch clock signal, and a drain terminal connected to the drain terminals of the twenty-first and twenty-second transistors for receiving the inverted gated clock signal; and a second inverter, connected to the drain terminals of the twenty-first and twenty-second transistors and the drain terminal of the twenty-fourth transistor, for receiving the inverted gated clock signal and generating the gated clock signal.

8. The circuit of claim 7, wherein the second inverter comprises:

a twenty-fifth transistor (350) having a source terminal for receiving the supply voltage, and a gate terminal connected to the drain terminals of the twenty-first and twenty-second transistors for receiving the inverted gated clock signal; and a twenty-sixth transistor (352) having a drain terminal connected to a drain terminal of the twenty-fifth transistor, a gate terminal connected to the gate terminal of the twenty-fifth transistor for receiving the inverted gated clock signal, and a source terminal connected to ground, wherein the gated clock signal is generated at the drain terminals of the twenty-fifth and twenty-sixth transistors.

9. A system for generating a gated clock signal, comprising:
- a first logic circuit for receiving a reset signal and an input clock signal and generating a latch clock signal; and
- a clock gating cell connected to the first logic circuit and including:
  - a latch circuit having a reset terminal for receiving the reset signal, an input terminal for receiving an enable signal, a clock input terminal connected to an output of the first logic circuit for receiving the latch clock signal, and an output terminal for providing a clocked enable signal; and
  - a second logic circuit having a first input terminal connected to the output terminal of the first logic circuit for receiving the latch clock signal and a second input terminal connected to the output terminal of the latch circuit for receiving the clocked enable signal, wherein the second logic circuit generates the gated clock signal.

10. The system of claim 9, wherein the first logic circuit includes at least one of an AND gate, an OR gate, a NOT gate, a NOR gate, a NAND gate, an XOR gate, an XNOR gate, and a combinational logic circuit.

11. The system of claim 9, wherein the second logic circuit includes at least one of an AND gate, an OR gate, a NOT gate, a NOR gate, a NAND gate, an XOR gate, an XNOR gate, and a combinational logic circuit.

12. The system of claim 9, wherein the first logic circuit comprises:
- a first transistor (302) having a source terminal for receiving a supply voltage, and a gate terminal for receiving the input clock signal;
- a second transistor (304) having a drain terminal connected to a drain terminal of the first transistor, and a gate terminal for receiving the reset signal, wherein an inverted input clock signal is generated at the drain terminals of the first and second transistors;
- a third transistor (306) having a drain terminal connected to a source terminal of the third transistor, a gate terminal connected to the gate terminal of the first transistor for receiving the input clock signal, and a source terminal connected to ground;
- a fourth transistor (308) having a source terminal for receiving the supply voltage, a gate terminal for receiving the reset signal, and a drain terminal connected to the drain terminals of the first and second transistors for receiving the inverted input clock signal; and
- a first inverter, connected to the drain terminals of the first and second transistors and the drain terminal of the fourth transistor, for receiving the inverted input clock signal and generating the latch clock signal.

13. The system of claim 12, wherein the first inverter comprises:
- a fifth transistor (310) having a source terminal for receiving the supply voltage, and a gate terminal connected to the drain terminals of the first and second transistors for receiving the inverted input clock signal; and
- a sixth transistor (312) having a drain terminal connected to a drain terminal of the fifth transistor, a gate terminal connected to the gate terminal of the fifth transistor for receiving the inverted input clock signal, and a source terminal connected to ground, wherein the latch clock signal is generated at the drain terminals of the fifth and sixth transistors.

14. The system of claim 13, wherein the latch circuit includes:
- a seventh transistor (314) having a source terminal for receiving the supply voltage, and a gate terminal for receiving a test enable signal;
- an eighth transistor (316) having a source terminal connected to a drain terminal of the seventh transistor, and a gate terminal for receiving the enable signal;
- a ninth transistor (318) having a source terminal connected to a drain terminal of the eighth transistor, and a gate terminal for receiving the latch clock signal;
- a tenth transistor (320) having a drain terminal connected to a drain terminal of the ninth transistor, and a gate terminal for receiving the inverted input clock signal, wherein an inverted clocked enable signal is generated at the drain terminals of the ninth and tenth transistors;
- an eleventh transistor (322) having a drain terminal connected to a source terminal of the tenth transistor, and a gate terminal connected to the gate terminal of the eighth transistor for receiving the enable signal;
- a twelfth transistor (324) having a drain terminal connected to the source and drain terminals of the tenth and eleventh transistors, respectively, and a gate terminal that receives the test enable signal;
- a thirteenth transistor (326) having a drain terminal connected to source terminals of the eleventh and twelfth transistors, a gate terminal for receiving the reset signal, and a source terminal connected to ground;
- a fourteenth transistor (328) having a source terminal for receiving the supply voltage, a gate terminal for receiving the reset signal, and a drain terminal connected to the drain terminals of the ninth and tenth transistors for receiving the inverted clocked enable signal;
- a fifteenth transistor (330) having a source terminal for receiving the supply voltage, and a gate terminal connected to the drain terminals of the ninth and tenth transistors for receiving the inverted clocked enable signal;
- a sixteenth transistor (332) having a drain terminal connected to a drain terminal of the fifteenth transistor, a gate terminal connected to the drain terminals of the ninth and tenth transistors for receiving the inverted clocked enable signal, and a source terminal connected to ground, wherein the clocked enable signal is generated at the drain terminals of the fifteenth and sixteenth transistors;
- a seventeenth transistor (334) having a source terminal for receiving the supply voltage, and a gate terminal connected to the drain terminals of the fifteenth and sixteenth transistors for receiving the clocked enable signal;
- an eighteenth transistor (336) having a source terminal connected to a drain terminal of the seventeenth transistor, and a gate terminal for receiving the inverted input clock signal;
- a nineteenth transistor (338) having a drain terminal connected to a drain terminal of the eighteenth transistor and to the drain terminal of the fourteenth transistor, and a gate terminal that receives the latch clock signal; and
- a twentieth transistor (340) having a drain terminal connected to a source terminal of the nineteenth transistor, a gate terminal connected to the gate terminal of the seventeenth transistor and to the drain terminals of the fifteenth and sixteenth transistors for receiving the clocked enable signal, and a source terminal connected to the source terminals of the eleventh and twelfth transistors.

15. The system of claim 14, wherein the second logic circuit comprises:
- a twenty-first transistor (342) having a source terminal for receiving the supply voltage, and a gate terminal for receiving the clocked enable signal;
- a twenty-second transistor (344) having a drain terminal connected to a drain terminal of the twenty-first transistor, and a gate terminal that receives the latch clock signal, wherein an inverted gated clock signal is generated at the drain terminals of the twenty-first and twenty-second transistors;
- a twenty-third transistor (346) having a drain terminal connected to a source terminal of the twenty-second transistor, a gate terminal connected to the gate terminal of the twenty-first transistor for receiving the clocked enable signal, and a source terminal connected to ground;
- a twenty-fourth transistor (348) having a source terminal for receiving the supply voltage, a gate terminal that receives the latch clock signal, and a drain terminal connected to the drain terminals of the twenty-first and twenty-second transistors for receiving the inverted gated clock signal; and
- a second inverter, connected to the drain terminals of the twenty-first and twenty-second transistors and the drain terminal of the twenty-fourth transistor, for receiving the inverted gated clock signal and generating the gated clock signal.

16. The system of claim 15, wherein the second inverter comprises:
- a twenty-fifth transistor (350) having a source terminal for receiving the supply voltage, and a gate terminal connected to the drain terminals of the twenty-first and twenty-second transistors for receiving the inverted gated clock signal; and
- a twenty-sixth transistor (352) having a drain terminal connected to a drain terminal of the twenty-fifth transistor, a gate terminal connected to the gate terminal of the twenty-fifth transistor for receiving the inverted gated clock signal, and a source terminal connected to ground, wherein the gated clock signal is generated at the drain terminals of the twenty-fifth and twenty-sixth transistors.

17. An integrated circuit, comprising:
- a plurality of digital logic elements;
- a plurality of first logic circuits, each receiving a reset signal and an input clock signal and generating a latch clock signal; and
- a plurality of clock gating cells, each clock gating cell connected between one of the plurality of first logic circuits and one of the digital logic elements, for providing a gated clock signal to the respective digital logic element, and wherein each clock gating cell includes:
  - a latch circuit having a reset terminal for receiving the reset signal, an input terminal for receiving an enable signal, a clock input terminal connected to an output terminal of the first logic circuit for receiving the latch clock signal, and an output terminal for generating a clocked enable signal; and
  - a second logic circuit having a first input terminal connected to the output terminal of the first logic circuit for receiving the latch clock signal and a second input terminal connected to the output terminal of the latch circuit for receiving the clocked enable signal, wherein the second logic circuit generates a gated clock signal based on the clocked enable signal.

18. The integrated circuit of claim 17, wherein the first and second logic circuits comprise AND gates.

19. The integrated circuit of claim 17, wherein the clock gating cells are part of a standard library of cells used to design the integrated circuit.

* * * * *